United States Patent
Mao (10) Patent No.: US 9,516,779 B2
(45) Date of Patent: Dec. 6, 2016

(54) SERVER APPARATUS AND CABLE MANAGEMENT MECHANISM THEREOF

(71) Applicant: Wistron Corporation, New Taipei (TW)

(72) Inventor: Zhong-hui Mao, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/963,194

(22) Filed: Dec. 8, 2015

(65) Prior Publication Data

US 2016/0242311 A1     Aug. 18, 2016

(30) Foreign Application Priority Data

Feb. 17, 2015   (CN) .......................... 2015 1 0086240

(51) Int. Cl.
   *H05K 7/00*    (2006.01)
   *H05K 7/14*    (2006.01)

(52) U.S. Cl.
   CPC .......... *H05K 7/1491* (2013.01); *H05K 7/1489* (2013.01)

(58) Field of Classification Search
   CPC combination set(s) only.
   See application file for complete search history.

(56) References Cited

U.S. PATENT DOCUMENTS 8,783,681 B2   7/2014   Hsu
9,030,827 B2   5/2015   Jau

FOREIGN PATENT DOCUMENTS

| CN | 203723704 U | 7/2014 |
|---|---|---|
| CN | 204087086 U | 1/2015 |
| TW | 201400302 A | 1/2014 |
| TW | 201408158 A | 2/2014 |

OTHER PUBLICATIONS

Office action mailed on Jan. 13, 2016 for the Taiwan application No. 104107926, filing date: Mar. 12, 2012, p. 1 line 14, p. 2-5 and p. 6 line 1-7.

*Primary Examiner* — Lisa Lea Edmonds
(74) *Attorney, Agent, or Firm* — Winston Hsu; Scott Margo (57) ABSTRACT

A server apparatus includes a holding portion, a server module, a cable management mechanism, a cable, and a tray movably disposed on the holding portion. The cable management mechanism is disposed at a side of the tray and includes first and second racks, a reversing module, and a pillar disposed on the second rack. The first rack is fixed to the holding portion. The second rack is slidably disposed at the side of the tray. The reversing module is connected to the tray and engaged with the first and second racks respectively. The cable is coupled to the server module when the cable is wound on the pillar along the side of the tray. When the tray is pulled outward, the second rack moves inward with movement of the reversing module for making the pillar move inward.

18 Claims, 6 Drawing Sheets

SERVER APPARATUS AND CABLE MANAGEMENT MECHANISM THEREOF

BACKGROUND OF THE INVENTION

1. Field of the Invention

The present invention relates to a server apparatus and a cable management mechanism, and more specifically, to a server apparatus capable of performing cable management on a cable wound on a pillar of a rack via linkage of a reversing module located at a side of a tray with the rack and the tray and a cable management mechanism thereof.

2. Description of the Prior Art

In general, a server apparatus usually has a host device (including major server components, such as a central processing unit and a server board) disposed on a holding plate and a detachable device (e.g. a hard disk drive) disposed on a tray slidably disposed on the holding plate, so that a user could pull out the tray to perform a device replacing operation on the server apparatus. Furthermore, the server apparatus could utilize cables to establish electrical connection between the detachable device and the host device. A conventional cable management method is to connect a foldable link frame to the tray and the holding plate and wind the cables along the foldable link frame, so that the foldable link frame could be expanded or folded with sliding of the tray relative to the holding plate. Accordingly, no matter the user pulls or pushes the tray relative to the holding plate, the cables could be always wound on the foldable link frame with expansion or folding of the foldable link frame, so as to achieve the cable management purpose.

However, since the foldable link frame has a complicated folding design and is disposed outside the tray, the aforesaid design may increase the manufacturing cost of the server apparatus and disposal of the foldable frame may occupy excessive internal space of the server apparatus so as to be disadvantageous to the thinning design and the internal configuration of the server apparatus. Furthermore, when the foldable link frame is folded with inward sliding of the tray, the foldable link frame could form a transverse folded structure to interfere with airflow in the server apparatus, so that the heat dissipating efficiency of the server apparatus could be influenced by the transverse folded structure.

SUMMARY OF THE INVENTION

The present invention provides a server apparatus. The server apparatus includes a holding portion, a tray, a server module, and a cable. The tray is movably disposed on the holding portion. The server module includes a detachable device and a host device. The detachable device is disposed on the tray. The host device is disposed on the holding portion. The cable management mechanism is disposed at a side of the tray. The cable management mechanism includes a first rack, a second rack, a reversing module, and a pillar. The first rack is fixed to the holding portion. The second rack is slidably disposed at the side of the tray. The reversing module is connected to the tray and engaged with the first rack and the second rack respectively. The pillar is disposed on the second rack. The cable is coupled to the host device and coupled to the detachable device when the cable is wound on the pillar along the side of the tray. When the tray is pulled along a first direction relative to the holding portion, the reversing module moves on the first rack with movement of the tray toward the first direction to move the second rack toward a second direction and to make the pillar move along the second direction. The first direction is opposite to the second direction.

The present invention further provides a cable management mechanism for cable management of a server apparatus. The server apparatus includes a holding portion, a tray, a server module, and a cable. The tray is movably disposed on the holding portion. The server module includes a detachable device and a host device. The detachable device is disposed on the tray. The host device is disposed on the holding portion. The cable is electrically connected to the host device. The cable management mechanism includes a first rack, a second rack, a reversing module, and a pillar. The first rack is fixed to the holding portion. The second rack is slidably disposed at the side of the tray. The reversing module is connected to the tray and engaged with the first rack and the second rack respectively. The pillar is disposed on the second rack. The cable is coupled to the detachable device when the cable is wound on the pillar along the side of the tray. When the tray is pulled along a first direction relative to the holding portion, the reversing module moves on the first rack with movement of the tray toward the first direction to move the second rack toward a second direction and to make the pillar move along the second direction. The first direction is opposite to the second direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
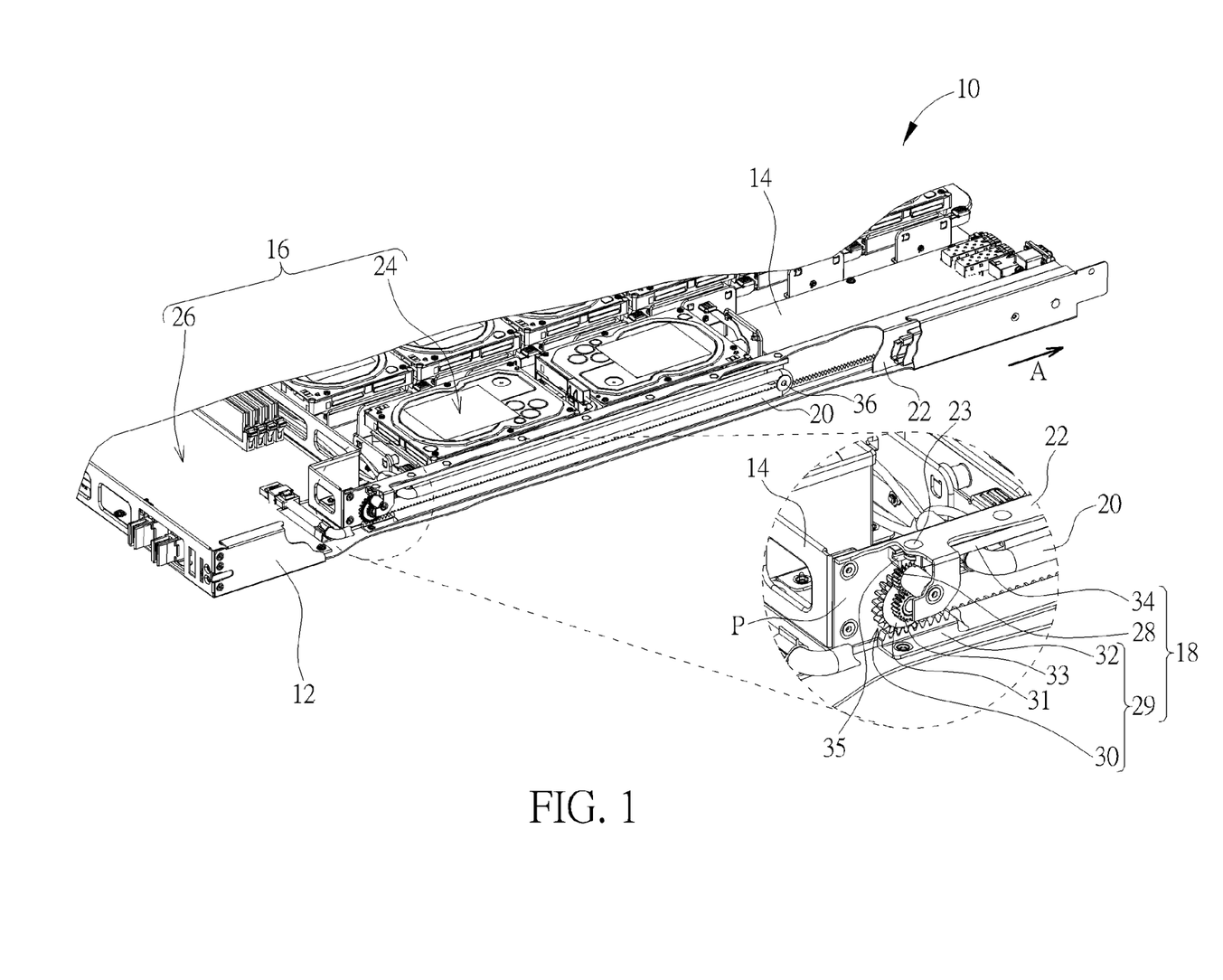
FIG. 1 is a partial diagram of a server apparatus according to an embodiment of the present invention.

Please refer to FIG. 1, which is a partial diagram of a server apparatus 10 according to an embodiment of the present invention. For clearly showing the internal mechanical design of the server apparatus 10, FIG. 1 is a partial enlarged and sectional diagram of the server apparatus 10. As shown in FIG. 1, the server apparatus 10 includes a holding portion 12 (e.g. a holding plate), a tray 14, a server module 16, a cable management mechanism 18, and a cable 20. The tray 14 is movably disposed on the holding portion 12 so that a user could pull out the tray 14 to replace a device (e.g. a hard disk drive) disposed on the tray 14. In this embodiment, a containing structure 22 is formed on a side P of the tray 14 (but not limited thereto) for containing the cable management mechanism 18 and the cable 20. The server module 16 includes a detachable device 24 and a host device 26. The detachable device 24 could be an electronic device detachably disposed in a conventional server apparatus, such as a hard disk drive, and could be disposed on tray 14. The host device 26 could include main server components (e.g. a central processing unit and a server board) and could be disposed on the holding portion 12.

Figure 2:
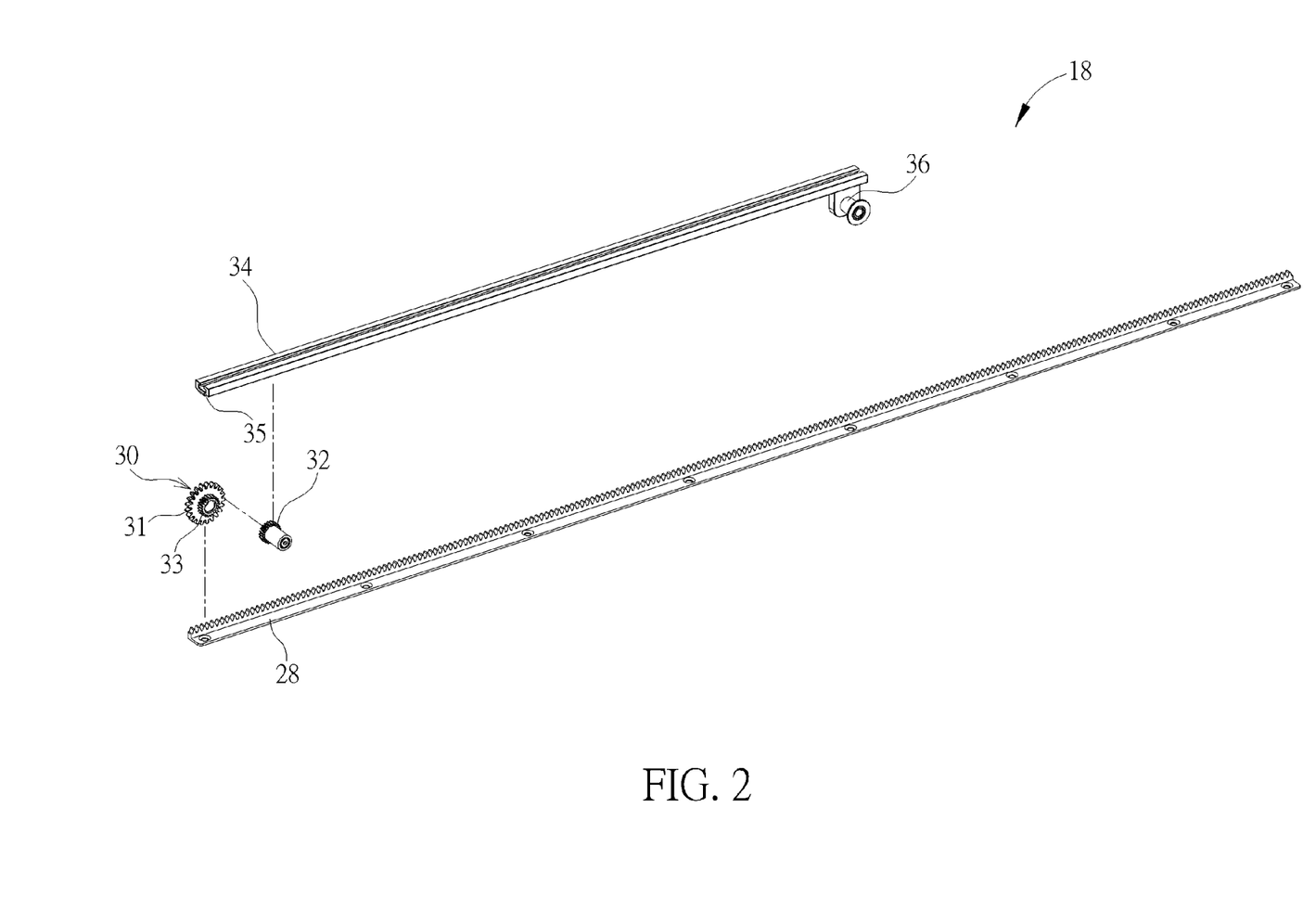
FIG. 2 is an exploded diagram of a cable management mechanism in FIG. 1.
Figure 3:
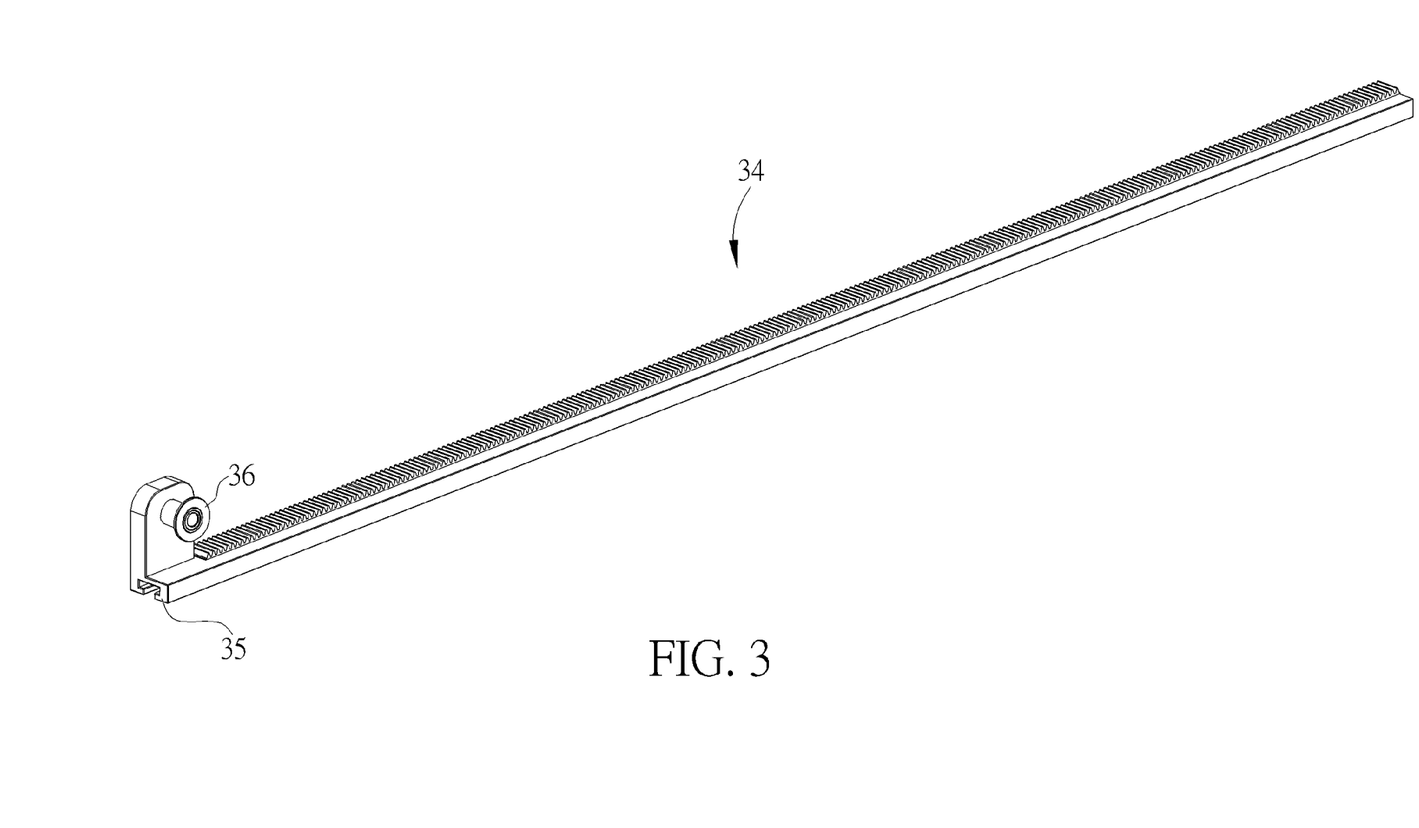
FIG. 3 is a diagram of a second rack in FIG. 2 at another viewing angle.

More detailed description for the mechanical design of the cable management mechanism 18 is provided as follows. Please refer to FIG. 1 and FIG. 2. FIG. 2 is an exploded diagram of the cable management mechanism 18 in FIG. 1. As shown in FIG. 1 and FIG. 2, the cable management mechanism 18 is disposed on the side P of the tray 14 and includes a first rack 28, a reversing module 29, a second rack 34, and a protruding pillar 36. The first rack 28 is disposed in the containing structure 20 and fixed to the holding portion 12 (e.g. by rivets). In this embodiment, the cable management mechanism 18 could adopt a gear driving design. For example, the reversing module 29 could include a driving gear 30 and a reversing gear 32. The driving gear 30 is pivoted to the tray 14 and engaged with the first rack 28. The reversing gear 32 is pivoted to the tray 14 and is engaged with the driving gear 30 and the second rack 34 respectively. The second rack 34 is slidably disposed in the containing structure 20. The pillar 36 is disposed on the second rack 34. To be more specific, in this embodiment, for further reducing space occupied by the driving gear 30 and the reversing gear 32, the driving gear 30 could have a first concentric gear 31 and a second concentric gear 33 as shown in FIG. 1. The first concentric gear 31 is engaged with the first rack 28. The second concentric gear 33 could have the same module with the reversing gear 32 to be engaged with the reversing gear 32. Furthermore, please refer to FIG. 3, which is a diagram of the second rack 34 in FIG. 2 at another viewing angle. As shown in FIG. 1, FIG. 2, and FIG. 3, the tray 14 has at least one I-shaped member 23 (eight shown in FIG. 1, but not limited thereto) in the containing structure 22, and a sliding slot 35 is formed on the second rack 34. The I-shaped member 23 is disposed through the sliding slot 35 to make the second rack 34 slidable on the I-shaped member 23 relative to the tray 14.

As shown in FIG. 1, the cable 20 is electrically connected to the host device 26 and is electrically connected to the detachable device 24 when the cable 20 is wound on the pillar 36 along the containing structure 22 in a tight fitting manner. For example, the cable 20 could pass through the side P of the tray 14 to be electrically connected to the detachable device 24 for establishing the electrical connection between the host device 26 and the detachable device 24. In practical application, the pillar 36 could preferably be a pulley. Accordingly, the pillar 36 could rotate with the cable 20 wound thereon for reducing the sliding friction between the cable 20 and the pillar 36, so as to increase life of the cable 20.

Figure 4:
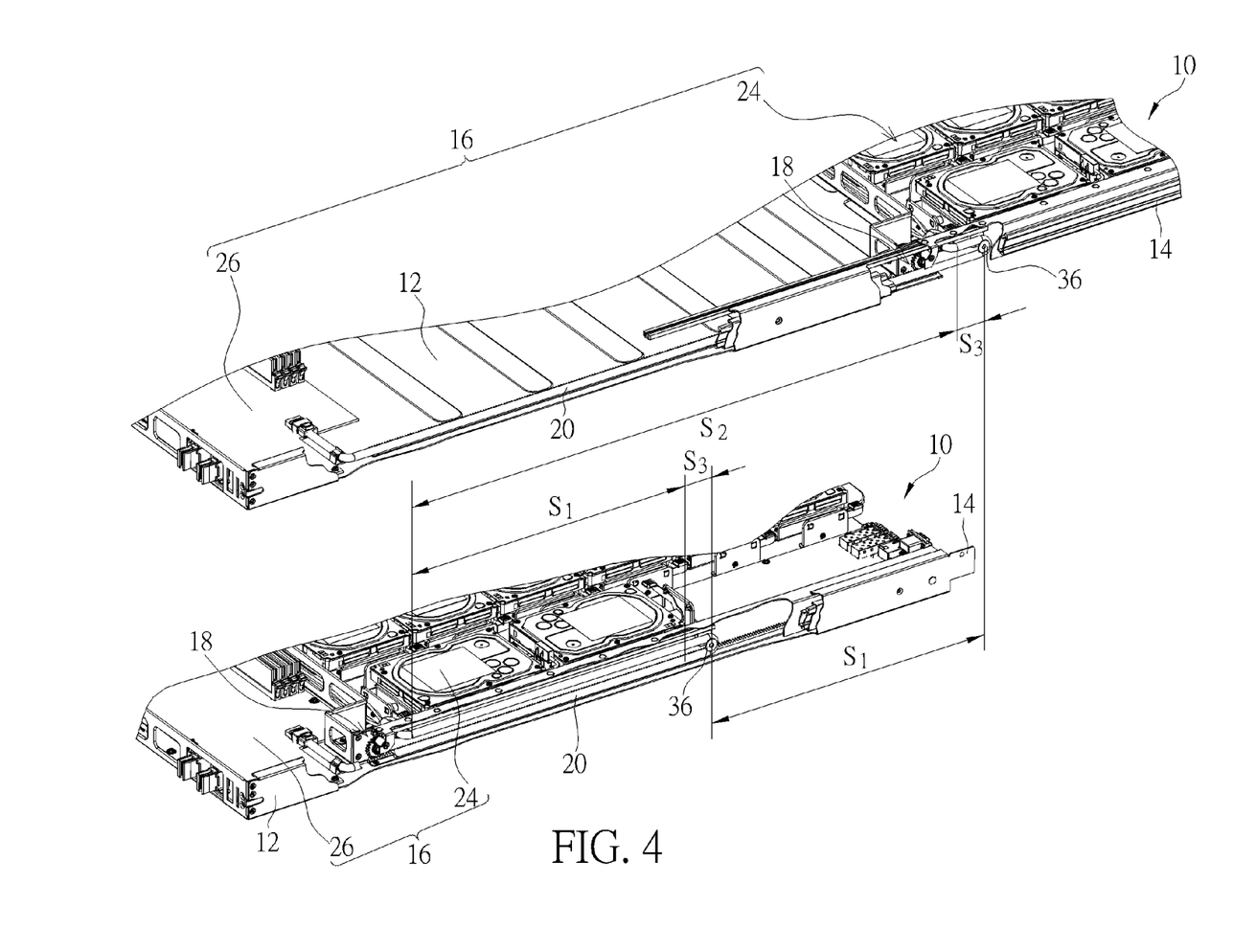
FIG. 4 is a comparison diagram of the server apparatus in FIG. 1 after being pulled out and the server apparatus in FIG. 1 after being pushed back.

To be noted, please refer to FIG. 4, which is a comparison diagram of the server apparatus 10 in FIG. 1 after being pulled out and the server apparatus 10 in FIG. 1 after being pushed back. For clearly showing the mechanical design of the server apparatus 10, FIG. 4 is a partial sectional diagram of the server apparatus 10 in FIG. 1. As shown in FIG. 4, since a sum of a travelling distance $S_2$ of the tray 14 relative to the holding portion 12 and a distance $S_3$ from the pillar 36 to an end of the cable 20 coupled to the detachable device 24 (i.e. the end of the cable 14 passing through the side P of the tray 14) is equal to a sum of the distance $S_3$ and twice a travelling distance $S_1$ of the pillar 36 in the containing structure 22 (i.e. $S_2+S_3=S_1+S_3+S_1$), the travelling distance $S_1$ of the pillar 36 in the containing structure 22 could be equal to one half of the travelling distance $S_2$ of the tray 14 relative to the holding portion (i.e. $S_2=2S_1$). Thus, in practical application, for preventing deformation of the cable 20 during the tray 14 moves relative to the holding portion 12, the server apparatus 10 could adopt the design that a linear velocity of the pillar 36 is equal to one half of a linear velocity of the tray 14 relative to the holding portion 12. To be more specific, according to the equation that a linear velocity of a gear is equal to a product of a pitch radius of the gear and an angular velocity of the gear, in this design, a pitch diameter of the second concentric gear 33 could be equal to one half of a pitch diameter of the first concentric gear 31, and the second concentric gear 33 could have the same module with the reversing gear 32, so as to achieve the purpose that the linear velocity of the pillar 36 is equal to one half of the linear velocity of the tray 14 relative to the holding portion 12. It should be mentioned that the driving gear 30 could only have one gear structure instead of the aforesaid design for simplifying the mechanical design of the cable management mechanism 18. For example, in another embodiment, the driving gear 30 could be an integrally-formed gear structure to be directly engaged with the reversing gear 32 and could have the same module with the reversing gear 32, and the pitch diameter of the reversing gear 32 could be equal to one half of a pitch diameter of the driving gear 30. In such a manner, the effect that the linear velocity of the pillar 36 is equal to one half of the linear velocity of the tray 14 relative to the holding portion 12 could be also generated.

Figure 5:
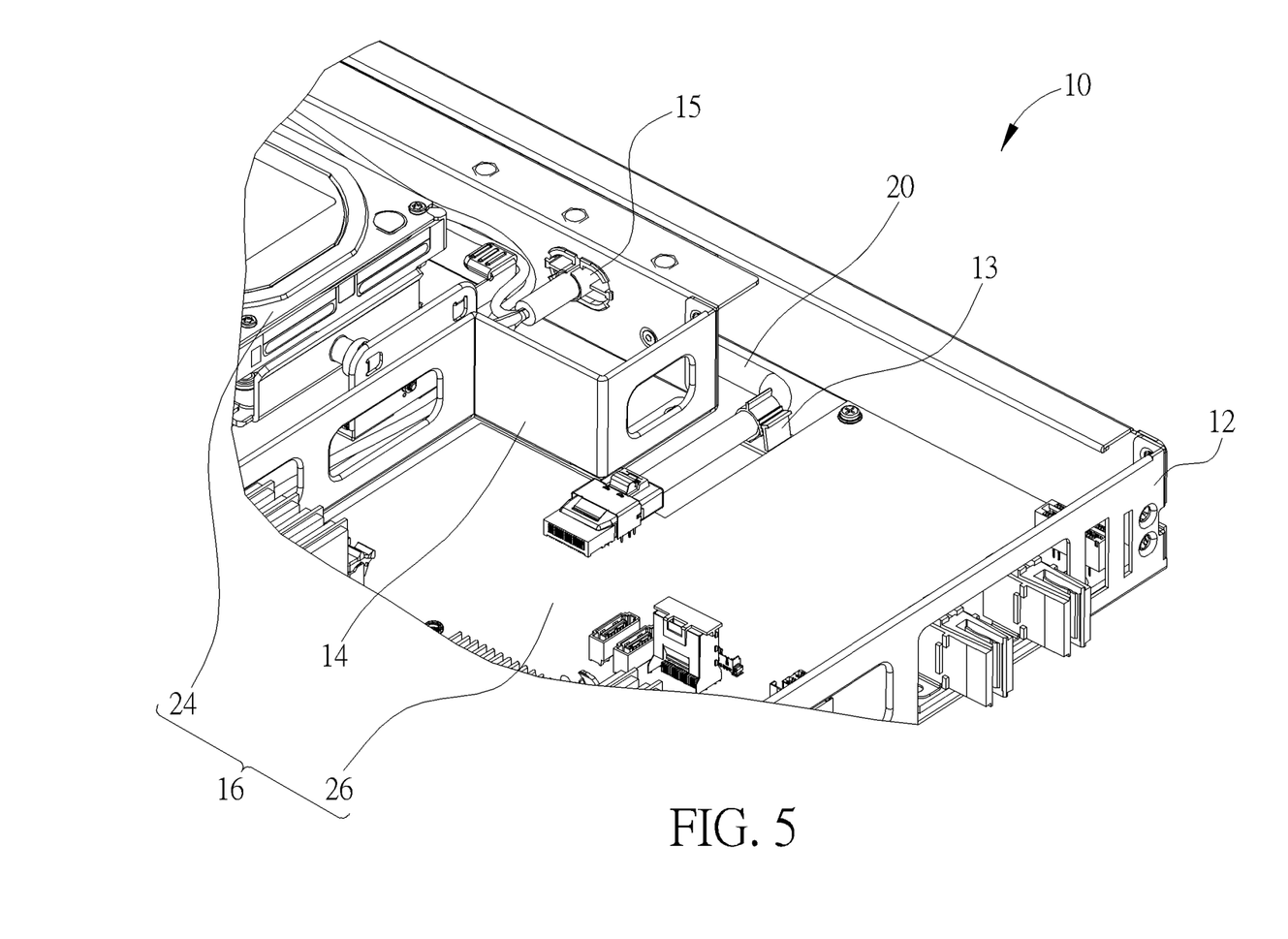
FIG. 5 is a partial diagram of the server apparatus in FIG. 1 at another viewing angle.

Please refer to FIG. 5, which is a partial diagram of the server apparatus 10 in FIG. 1 at another viewing angle. As shown in FIG. 5, the holding portion 12 could have a cable fixing structure 13 for fixing the cable 20, and the tray 14 could have a cable fixing structure 15 for fixing the cable 20 after the cable 20 passes through the side P of the tray 14. Via the aforesaid fixing design, the cable 20 could be coupled to the detachable device 24 and the host device 26 steadily, so as to efficiently prevent the cable 20 from falling off the server apparatus 10 accidentally during the tray 14 moves relative to the holding portion 12.

Figure 6:
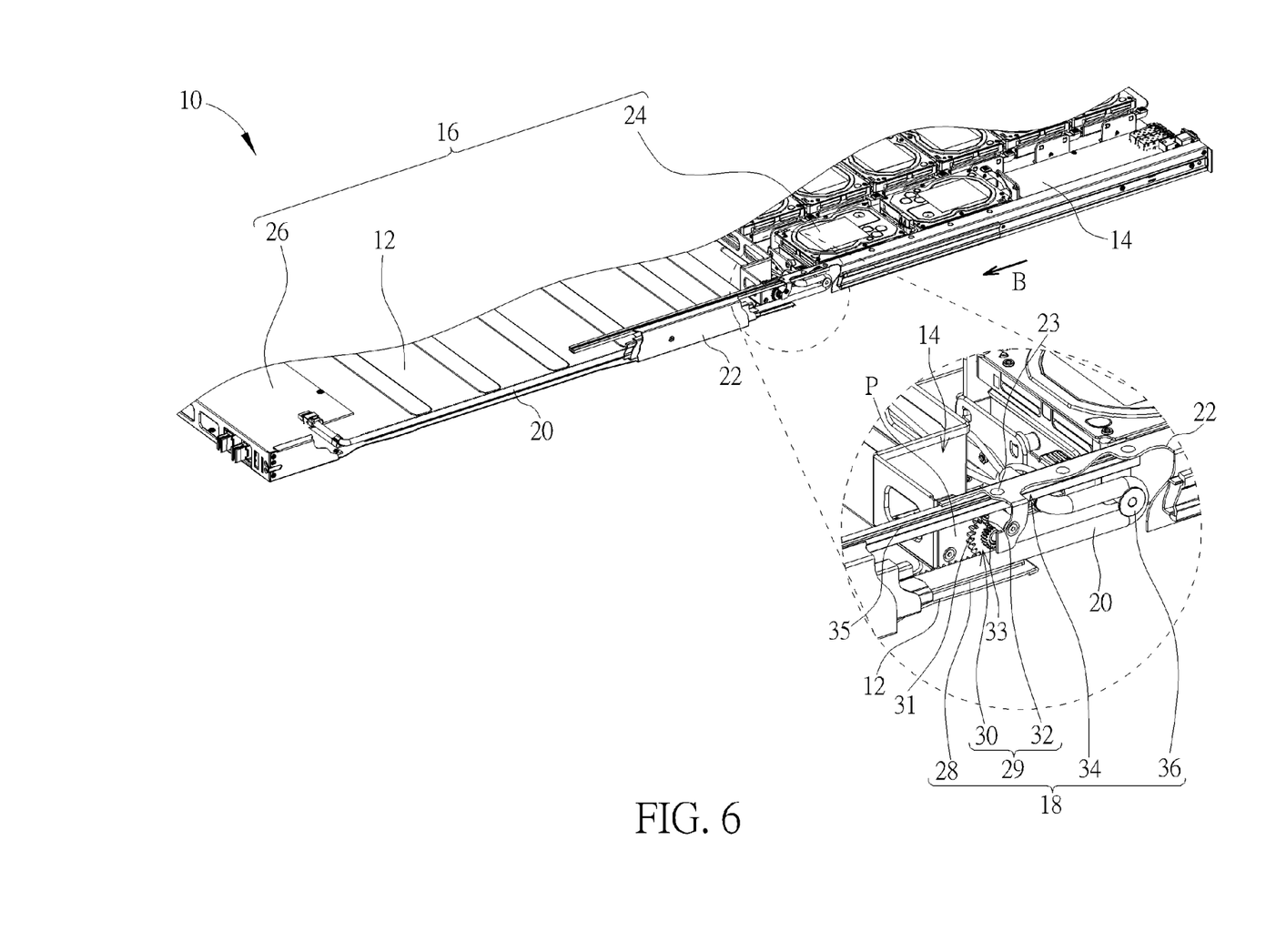
FIG. 6 is a partial diagram of a tray in FIG. 1 being pulled out.

Please refer to FIG. 1 and FIG. 6. FIG. 6 is a partial diagram of the tray 14 in FIG. 1 being pulled out. For clearly showing the mechanical design of the server apparatus 10, FIG. 6 is a partial enlarged and sectional diagram of the server apparatus 10 in FIG. 1. When a user wants to replace the detachable device 24 in the server apparatus 10, the user just needs to pull out the tray 14 from a position as shown in FIG. 1 to a position as shown in FIG. 6 in a first direction A, so that the user could perform a device replacing operation on the detachable device 24. During the aforesaid process, as shown in FIG. 1 and FIG. 6, the first concentric gear 31 on the driving gear 30 could rotate clockwise on the first rack 28 with outward movement of the tray 14 in the first direction A. Accordingly, the second concentric gear 33 on the driving gear 30 engaged with the reversing gear 32 could rotate clockwise to rotate the reversing gear 32 counterclockwise, so as to make the reversing gear 32 drive the second rack 34 to move inwardly in a second direction B (opposite to the first direction A) and to make the pillar 36 move inwardly to a position as shown in FIG. 6. In such a manner, the configuration of the cable 20 could be changed from FIG. 1 to FIG. 6, so as to prevent deformation of the cable 20.

On the other hand, after the user completes the aforesaid device replacing process of the server apparatus 10, the user just needs to push the tray 14 from the position as shown in FIG. 6 back to the position as shown in FIG. 1 in the second direction B. During the aforesaid process, the first concentric gear 31 on the driving gear 30 could move with inward movement of the tray 14 in the second direction B to rotate counterclockwise on the first rack 28. Accordingly, the second concentric gear 33 on the driving gear 30 could rotate counterclockwise to rotate the reversing gear 32 clockwise, so as to make the reversing gear 32 drive the second rack 34 to move outwardly in the first direction A and make the pillar 36 move outwardly to a position as shown in FIG. 1 in the first direction A. In such a manner, the configuration of the cable 20 could be changed from FIG. 6 to FIG. 1, so as to prevent deformation of the cable 20.

Via the tight fitting design that the cable is wound on the pillar of the second rack along the side of the tray and the linkage design that the pillar having the cable wound thereon moves in the opposite direction with movement of the tray, the present invention could prevent deformation of the cable during the tray moves relative to the holding portion to generate the cable management effect. Furthermore, since the cable management mechanism is disposed at the side of the tray, the server apparatus provided by the present invention could efficiently solve the prior art problem that the manufacturing cost of the server apparatus is increased due to the complicated folding design of the foldable link frame, the foldable link frame occupies excessive internal space of the server apparatus, and the foldable link frame in a transverse folded state influences the heat dissipating efficiency of the server apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server apparatus comprising:
    a holding portion;
    a tray movably disposed on the holding portion;
    a server module comprising:
        a detachable device disposed on the tray; and
        a host device disposed on the holding portion;
    a cable management mechanism disposed at a side of the tray, the cable management mechanism comprising:
        a first rack fixed to the holding portion;
        a second rack slidably disposed at the side of the tray;
        a reversing module connected to the tray and engaged with the first rack and the second rack respectively; and
        a pillar disposed on the second rack; and
    a cable coupled to the host device and coupled to the detachable device when the cable is wound on the pillar along the side of the tray;
    wherein when the tray is pulled along a first direction relative to the holding portion, the reversing module moves on the first rack with movement of the tray toward the first direction to move the second rack toward a second direction and to make the pillar move along the second direction; the first direction is opposite to the second direction.

2. The server apparatus of claim 1, wherein the reversing module comprises:
    a driving gear pivoted to the tray and engaged with the first rack; and
    a reversing gear pivoted to the tray and engaged with the driving gear and the second rack, the driving gear rotating on the first rack with movement of the tray toward the first direction to rotate the reversing gear so as to make the reversing gear move the second rack toward the second direction and to make the pillar move along the second direction to approach an end of the cable electrically connected to the detachable device.

3. The server apparatus of claim 2, wherein the driving gear has the same module with the reversing gear, and a pitch diameter of the reversing gear is equal to one half of a pitch diameter of the driving gear.

4. The server apparatus of claim 2, wherein the driving gear has a first concentric gear and a second concentric gear, the first concentric gear is engaged with the first rack, the second concentric gear is engaged with the reversing gear and has the same module with the reversing gear, and a pitch diameter of the second concentric gear is equal to one half of a pitch diameter of the first concentric gear.

5. The server apparatus of claim 1, wherein a containing structure is formed on the side of the tray for containing the cable management mechanism.

6. The server apparatus of claim 5, wherein a travelling distance of the pillar in the containing structure is equal to one half of a travelling distance of the tray relative to the holding portion.

7. The server apparatus of claim 5, wherein the tray has at least one I-shaped member in the containing structure, a sliding slot is formed on the second rack, and the at least one I-shaped member is disposed through the sliding slot to make the second rack slidable on the at least one I-shaped member relative to the tray.

8. The server apparatus of claim 1, wherein the pillar is a pulley.

9. The server apparatus of claim 1, wherein the holding portion has a cable fixing structure for fixing the cable.

10. The server apparatus of claim 1, wherein the tray has a cable fixing structure for fixing the cable after the cable passes through the side of the tray to be electrically connected to the detachable device.

11. A cable management mechanism for cable management of a server apparatus, the server apparatus comprising a holding portion, a tray, a server module, and a cable, the tray being movably disposed on the holding portion, the server module comprising a detachable device and a host device, the detachable device being disposed on the tray, the host device being disposed on the holding portion, the cable being electrically connected to the host device, the cable management mechanism comprising:
    a first rack fixed to the holding portion;
    a second rack slidably disposed at the side of the tray;
    a reversing module connected to the tray and engaged with the first rack and the second rack respectively; and
    a pillar disposed on the second rack;
    wherein the cable is coupled to the detachable device when the cable is wound on the pillar along the side of the tray; when the tray is pulled along a first direction relative to the holding portion, the reversing module moves on the first rack with movement of the tray toward the first direction to move the second rack toward a second direction and to make the pillar move along the second direction; the first direction is opposite to the second direction.

12. The cable management mechanism of claim 11, wherein the reversing module comprises:
    a driving gear pivoted to the tray and engaged with the first rack; and
    a reversing gear pivoted to the tray and engaged with the driving gear and the second rack, the driving gear rotating on the first rack with movement of tray toward the first direction to rotate the reversing gear so as to make the reversing gear move the second rack toward the second direction and to make the pillar move along the second direction to approach an end of the cable electrically connected to the detachable device.

13. The cable management mechanism of claim 12, wherein the driving gear has the same module with the reversing gear, and a pitch diameter of the reversing gear is equal to one half of a pitch diameter of the driving gear.

14. The cable management mechanism of claim 12, wherein the driving gear has a first concentric gear and a second concentric gear, the first concentric gear is engaged with the first rack, the second concentric gear is engaged with the reversing gear and has the same module with the reversing gear, and a pitch diameter of the second concentric gear is equal to one half of a pitch diameter of the first concentric gear.

15. The cable management mechanism of claim 11, wherein a containing structure is formed on the side of the tray for containing the cable management mechanism.

16. The cable management mechanism of claim 15, wherein a travelling distance of the pillar in the containing structure is equal to one half of a travelling distance of the tray relative to the holding portion.

17. The cable management mechanism of claim 15, wherein the tray has at least one I-shaped member in the containing structure, a sliding slot is formed on the second rack, and the at least one I-shaped member is disposed through the sliding slot to make the second rack slidable on the at least one I-shaped member relative to the tray.

18. The cable management mechanism of claim 11, wherein the pillar is a pulley.

* * * * *